US006999544B2

(12) United States Patent
Cranford, Jr. et al.

(10) Patent No.: US 6,999,544 B2
(45) Date of Patent: Feb. 14, 2006

(54) APPARATUS AND METHOD FOR OVERSAMPLING WITH EVENLY SPACED SAMPLES

(75) Inventors: Hayden Clavie Cranford, Jr., Apex, NC (US); Vernon Roberts Norman, Cary, NC (US); Martin Leo Schmatz, Gallen (CH)

(73) Assignee: International Business Machines Corporation, Armonk, NY (US)

( * ) Notice: Subject to any disclaimer, the term of this patent is extended or adjusted under 35 U.S.C. 154(b) by 785 days.

(21) Appl. No.: 09/997,587

(22) Filed: Nov. 28, 2001

(65) Prior Publication Data

US 2002/0146084 A1 Oct. 10, 2002

Related U.S. Application Data

(60) Provisional application No. 60/266,365, filed on Feb. 2, 2001.

(51) Int. Cl.
*H04L 7/04* (2006.01)
(52) U.S. Cl. ...................... 375/360; 375/326; 375/327; 375/373; 375/376; 331/1 A
(58) Field of Classification Search ................ 375/360, 375/326, 327, 371, 373, 376, 394; 370/350; 331/1 A, 12
See application file for complete search history.

(56) References Cited

U.S. PATENT DOCUMENTS

| 5,059,924 | A |   | 10/1991 | JenningsCheck ............ 331/1 A |
|-----------|---|---|---------|-----------------------------------|
| 5,555,247 | A |   | 9/1996  | Matsuoka et al. ........ 370/105.1 |
| 5,592,515 | A | * | 1/1997  | Saban et al. ................. 375/340 |
| 5,732,109 | A | * | 3/1998  | Takahashi ................... 375/326 |
| 5,982,834 | A |   | 11/1999 | Drost et al. ................. 375/373 |
| 2002/0009170 | A1 | * | 1/2002 | Schmatz ..................... 375/371 |
| 2004/0066871 | A1 | * | 4/2004 | Cranford et al. ............ 375/371 |

* cited by examiner

*Primary Examiner*—Shuwang Liu
(74) *Attorney, Agent, or Firm*—James A. Lucas; Driggs, Lucas, Brubaker & Hogg Co., LPA (57) ABSTRACT

The architecture and the method of operation of a receiver core are described. The core performs clock and data recovery on an incoming serial data stream transmitted across a wired media, such as a chip-to-chip or card-to-card interconnect. The bit error rate and accuracy of the recovery are optimized without centering of oversampling. Further, random errors due to edge mis-tracking are minimized. The receiver utilizes a phase rotator to detect the edge position of the bits of the data stream, select the optimum data sample and generate early and late signals if the detected edge is not in the expected position. A phase locked loop provides a frequency source for the phase rotator. At least three evenly spaced samples are detected for each bit. A sample processing algorithm, preferably an adaptive behavior algorithm, is used for centering the bit edge between two of the samples.

19 Claims, 4 Drawing Sheets

FIG. 1
Receiver Concept Diagram

FIG. 2

FIG. 3
State diagram of Phase Rotator Control

FIG. 4

APPARATUS AND METHOD FOR OVERSAMPLING WITH EVENLY SPACED SAMPLES

RELATED APPLICATIONS

This application claims the benefits of provisional patent application Ser. No. 60/266,365, filed Feb. 2, 2001, for "Apparatus and Method for Oversampling with Evenly Spaced Samples".

This application is related to the following copending applications, all of which are incorporated herein by reference: Ser. No. 09/996,113, filed Nov. 28, 2001, for "Unified Digital Architecture" ; Ser. No. 09/996,091, filed Nov. 28, 2001, for "Architecture for Advanced Serial Link Between Two Cards" ; and Ser. No. 09/996,053, filed Nov. 28, 2001, for "Analog Unidirectional Serial Link Architecture".

FIELD OF THE INVENTION

The present invention relates to a receiver core that performs clock and data recovery on an incoming serial data stream that is transmitted across wired media, such as a chip-to-chip or card-to-card interconnect.

BACKGROUND OF THE INVENTION

Serial data must be transmitted across wired media. The transmit and receive sections include chips wired to one another and card-to-card interconnects. The transmission media can be a combination of a printed circuit board, connectors, backplane wiring, fiber or cable. The interconnect can include its own power, data and clocking sources or may derive these functions from a host module. Such data has typically been transmitted through a parallel data bus, such as ISA, PCI, PCI-X and the like. One drawback of such parallel links is the moderate rate of data transmission as compared to improved microprocessor performance, resulting in data transfer bandwidths that typically outpace I/O transfer rates. Also, the ASIC I/O count is high. In addition, the system integration I/O count using a parallel data bus is high. Finally, the overall system cost associated with the use of the parallel data bus tends to be high.

A clock and data recovery system recovers a clock signal from a high speed data stream. The system uses high speed, low power clock recovery circuits. Analog techniques for recovery of the clock signal have drawbacks. Among them is the need to use a low pass filter to store a control voltage. Another drawback is that they only achieve recovery over a very small bandwidth relative to the data rate. Some have achieved clock and data recovery by use of an oscillator locked to an incoming signal. Others have used frame synchronization using QAM (queued access method) modulation. Still others have used a method of clock frequency multiplication. None of these prior art systems utilizes a clock and data recovery based on oversampling, which is a technique that is used to improve the signal to noise ratio in transmission systems by spreading out the noise induced by the digital-to-analog converter over a greater frequency range.

Typical clock/data recovery based on a single sample per bit, requires a phase/frequency detector. Also, oversampling with two samples per bit typically places one sample in the center of the bit and one on the edge, detecting 50/50 zeros and ones from edge samples when centered. This type of oversampling depends on the statistical detection of the edge samples and, therefore, has a non-zero probability of making an incorrect decision about the position of the edge in the presence of random phase noise. The receiver structure performs clock and data recovery (CDR) on the incoming serial bit stream. The quality of this operation is a dominant factor for the bit error rate (BER) performance of the system.

BRIEF DESCRIPTION OF THE PRESENT INVENTION

The present invention overcomes the drawbacks of the prior art. It is one objective to reduce random errors due to edge mis-tracking. Another objective is to optimize power and accuracy without centering of oversampling of clock and data recovery. Yet another objective is to provide a stable clock recovery system while improving the bit error rate performance of the clock and data recovery. Still another objective is to provide an oversampling method that is able to improve signal to noise ratio without requiring a substantial amount of processing time or power.

These and other objectives that will become apparent upon reading the description that follows are achieved by combining feed forward and feedback controls in one receiver architecture.

The invention comprises a system and a method of oversampling clock and data recovery. The system and the method comprise a detector and the step of digitally locating the edge position of a bit in a data stream. A generator creates an early and a late signal if the detected edge is not in its expected position and for sending the signal to a phase rotation control state machine. The edge position detector is provided with means for detecting at least three evenly spaced samples of each bit. A sample processing algorithm centers the bit edge in the middle between two samples. A phase rotator control state machine processes the early or late outputs from the edge location detector, and controls the phase settings. The phase rotator typically is a 54-step rotator comprising six phases with three inter-slice phase steps further divided by three. It controls the phase output of a clock generator. The system further includes a phase locked loop, such as a multi-phase half rate PPL. The phase locked loop includes a digital coarse loop and an analog fine loop wherein the digital coarse loop provides a PLL frequency control signal to an analog fine loop. The phase locked loop controls a three-stage ring oscillator running at one-half bit frequency.

The invention furthermore relates to a receiver core for performing clock and data recovery on a wire transmitted incoming serial data stream. The receiver core comprises a phase locked loop running at one-half of the bit frequency. A ring oscillator is controlled by a voltage signal and a current signal from the phase locked loop. A 54-step phase rotator is under the control of a phase rotator control state machine to control phase output of a clock generator. A detector digitally detects the edge position in a data stream. The core includes means for digitally selecting the optimum data sample and a generator for generating an early and a late signal if the detected edge is not in its expected position, and for sending the signal to a phase rotation control state machine. The phase rotator control state machine processes the early or late outputs from the edge correlation outputs to control the phase settings of the phase rotator wherein the early and late signal generating circuitry controls the output phase position of a phase locked loop; said phase locked loop includes a feed back loop to suppress low frequency jitter and a feed forward loop to suppress high frequency jitter.

DETAILED DESCRIPTION OF THE INVENTION

The receiver core of the present invention is a three-fold oversampled half-rate system with a 54-step phase rotator, advanced digital bang-bang control circuit and an implementation of a sample processing algorithm that centers the static edge in the middle between two samples. The receiver takes a signal, such as an NRZ encoded baseband signal, from a serially wired transmitter and aligns the edges to determine where the signal switches between '1's and '0's. As with other signals, the problem is placing the center point between the edges. This is a achieved by sampling the signal and generating early or late signals based on whether the signal is being sampled too early or too late. When the frequency of the early signals is more than that of the late signals, the system drifts in the 'early' direction. Conversely, it drifts in the 'late' direction when the frequency of the late signals is greater that that of the 'early' signals.

This invention addresses the problem of incorrect decisions based on over-the-edge sampling by disclosing the use of oversampling which uses evenly spaced samples, but without placing a sample over the edge of the bit. Instead, this invention positions the samples so that no samples are on the bit edge, but instead samples are placed on either side of the edge. This method has a reduced probability of incorrectly predicting the position of the edge in the presence of random phase noise. This improvement directly affects BER (bit error rate) which is a primary goal of such systems.

The data is oversampled and a digital circuit detects the edge position in the data stream. This digital circuit not only selects the optimum data sample, but also generates early and late signals, if the detected edge is not at its expected position. No signal is generated if no edge is found. Three or more evenly spaced samples make fewer errors on detection of edge because it is not centered on the data edge and is less likely to make consecutive incorrect decisions. The receiver architecture is a three-fold oversampled half-rate system with a 54-step phase rotator and an algorithm, such as an adaptive sample processing algorithm, centering the bit edge in the middle between two samples. A phase locked loop (PLL) controls a three-stage voltage controlled ring oscillator (VCO) running at half the bit frequency. Each stage includes a voltage controlled current source coupled to an n-type MOS (metal-oxide semiconductor) transistor. The current source is preferably a p-type MOS transistor. The oscillator is controlled by a voltage signal and by a current signal.

Each PLL can be shared by multiple receivers. The six phases from the VCO are fed into a phase rotator having 54 steps for a $2\pi$ interval. The 54 steps are generated with a finite inpulse response (FIR) phase rotator having six phases with three inter-slice phase steps that are further divided by three.

The six outputs of the rotator are buffered, and the edges are shaped to be able to sample a signal having twice the frequency. One of the phase outputs is used as a local recovery clock. A clock buffer makes sure that it is not loading the phase rotator too much. Logic timing analysis determines which phase is the optimum to use as the local recovery clock. The output section of the phase rotator suppresses common mode signals and performs a limiting signal.

The output is then driven out to the phase buffers (with the signals from the phase rotator) which, in turn, provides clocks. Six samples are taken over a two-bit interval. Three pipeline stages are added in order to reduce the probability of a metastable state to a value much lower than the targeted bit error rate. The stages also help to align the data to one single clock phase. In order to be able to process information from more than one bit interval for the recovery of one data bit, a memory stage re-uses four samples from the previous sampling period. A total of 10 samples are, therefore, fed into the half rate edge and data detection correlation blocks that make use of a pattern recognition algorithm. The outputs of the edge and data detectors are the recovered two bit and the early and late signals going to the phase rotator control state machine. A bang-bang control circuit with adaptive step size is used for this purpose. The rotator counter and temperature code generator generates the 54 control signals for the phase rotator and this closes the CDR loop.

The data path consists of a shift register which loads two bits from the data correlation blocks during each half-rate cycle. The shift register is loaded to a word data register (8 or 10 bits) using a word clock derived from the PLL clock.

The receiver architecture is supported by four major analog elements, a half data rate PLL, a phase rotator, a phase buffer and a sample latch. The function of each of these elements will be described in more detail hereinafter. The data interface for each receiver link comprises an output data bus, a mode control bit, and an output data clock. The mode control bit determines if the receiver core is operating on an 8-bit or a 10-bit transmitter output.

The phase adjustment and clock recovery is done by a phase rotator, and not by using a DLL or PLL control loop. If there is more than one analog PLL or DLL on one chip, these circuits tend to interact via supply and/or substrate coupling. It would, therefore, be difficult to control their phases/delay in an analog fashion. The use of an independent PLL clock generator and an external phase rotator makes the system more immune to injected noise. The control of the phase shift is digital. The system operates at half the bit rate. For analysis of edges and data, however, three-bit intervals are used in order to have a half bit overlap on both sides. Some of the actual samples are reused in the analysis cycle described below. The rotator control state machine has a 'fly wheel' function. It monitors the phase update rate and applies an update even if no edge information is measured. This allows a TX to RX frequency offset even with a very long (>1024 bit) run length, if the jitter of the two clocks is small enough.

The receiver analyzes the oversampled data stream and generates two sets of correlation output signals, the detected bit values and the early and late signals, for an eventual update of the phase rotator. When the detected bit edge is centered between two samples, there is a 'dead-zone' in the CDR control loop if no jitter is present. With a jitter number larger than the sample spacing, the loop will average the detected sample crossings and will position the edge in the middle between two samples. This is a different situation than that found in a PLL phase detector with a dead zone, because the jitter is much larger and the phase control is digital with no leakage effects. The probability of generating a metastable sampling output is reduced for a middle edge position because the probability of an edge being positioned right on a sample is reduced.

The receiver structure performs clock and data recovery (CDR) on the incoming serial data stream. The quality of this operation is a dominant factor for the bit error rate (BER) performance of the system. In order to overcome the drawbacks of the conventional methods, feed forward and feedback controls are combined in one receiver architecture. The data is oversampled and a digital circuit detects the edge position in the data stream. This digital circuit not only selects the optimum data sample, but also generates an early or late signal, if the detected edge is not at its expected position. No signal is generated if no edge is found. The phase rotator control state machine processes the early and late signals from the edge correlation outputs to control the output phase settings of a multi-phase PLL in a feedback loop. This feedback loop takes care of low frequency jitter phenomenon of unlimited amplitude, while the feed forward section suppresses high frequency jitter having limited amplitude. The static edge position is held at a constant position in the oversampled data array by a constant adjustment of the sampling phases with the early and late signals.

In principle, the early/late signals can be used to directly control the output phase positions of a multiphase clock generator PLL. This would, however, dictate the use of one PLL per channel or receiver. If a phase rotator device is used to control the phase output of the clock generator, one PLL may be used for several receivers.

Figure 1:
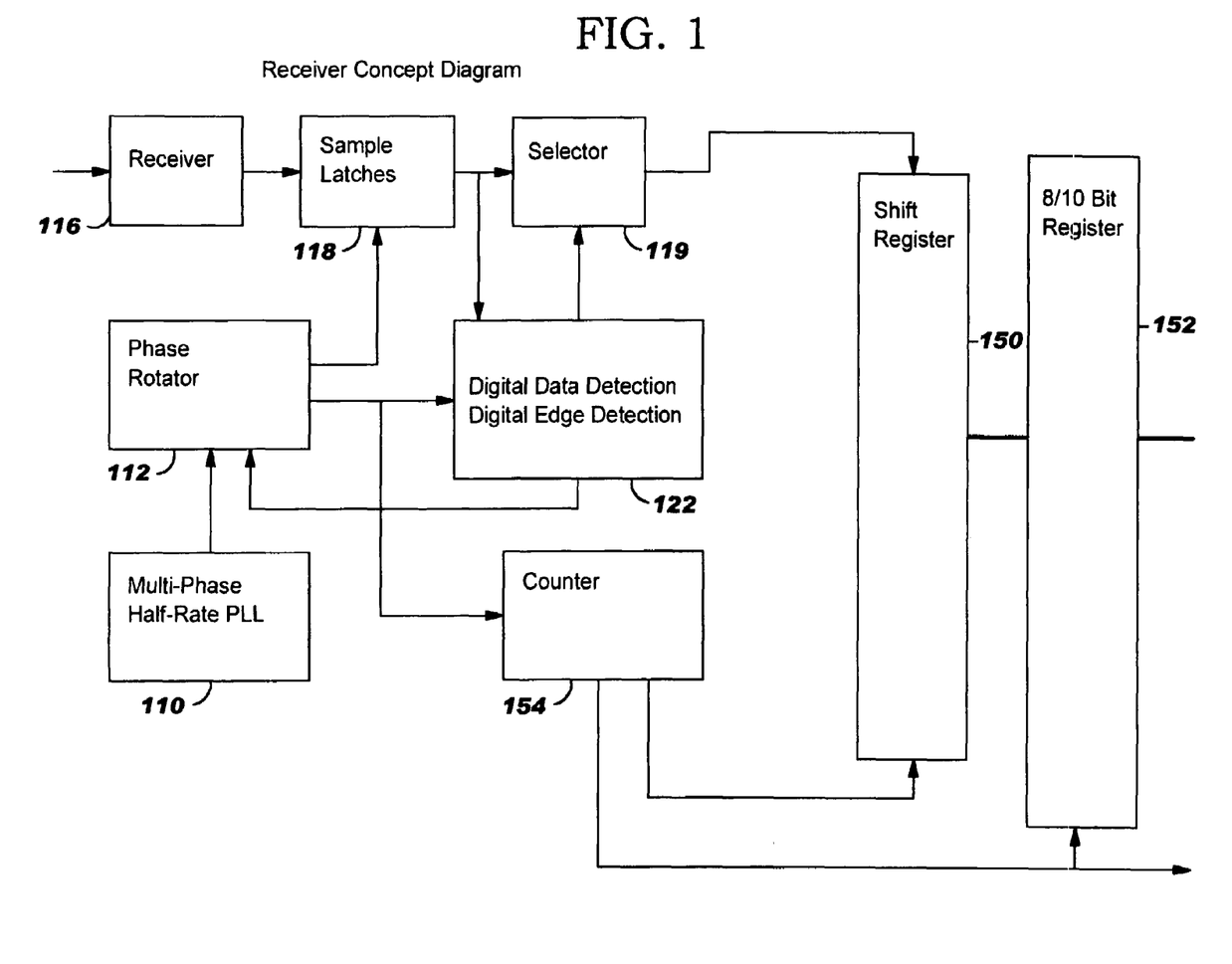
FIG. 1 is a receiver concept diagram.
Figure 2:
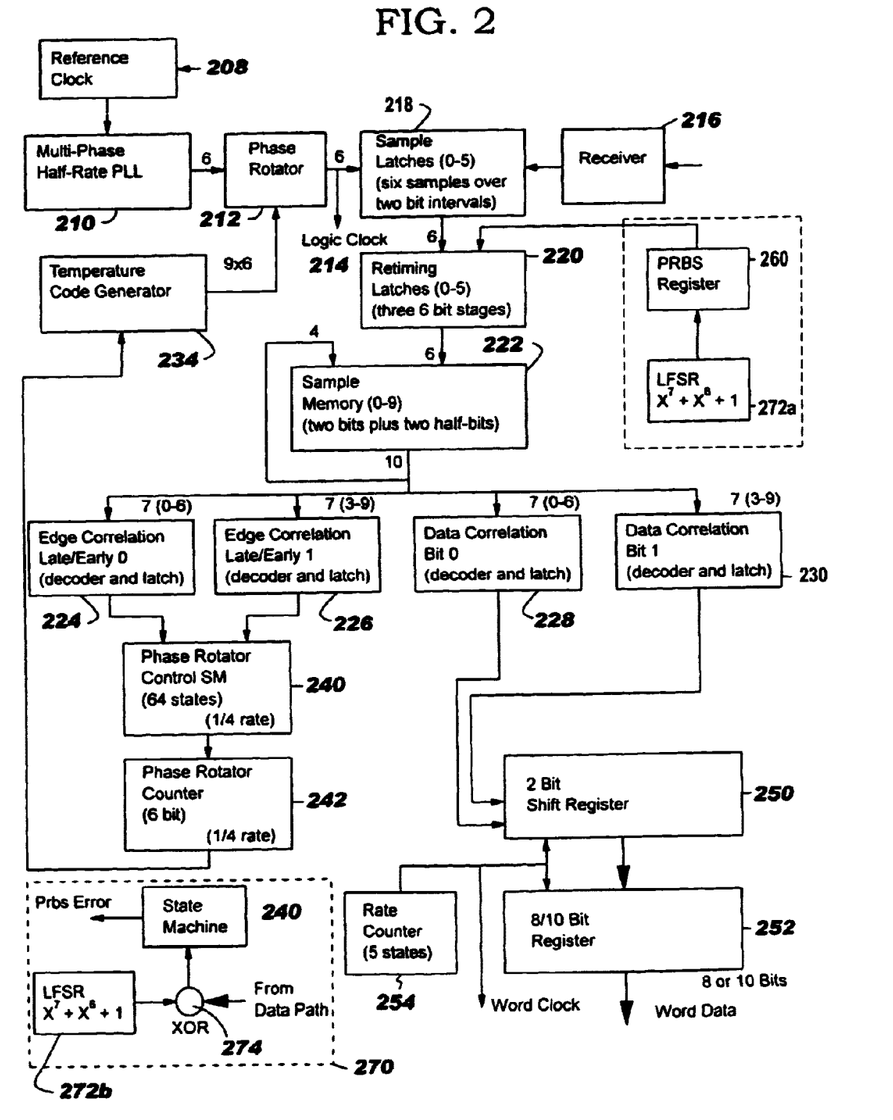
FIG. 2 is a block diagram of the receiver architecture of the present invention.

FIG. 1 shows a phase rotator 112 which is a building block that accepts several input phases from a multiphase half rate PLL 110 and performs a simultaneous shift of all phases by a fixed number of degrees. In one adjustment step, only a given predetermined phase step may be accomplished in order to guarantee that no glitch occurs. The overall phase shift is unlimited (modulo 360 degrees) to allow 'round-robin' operation. This building block is part of a clock/data recovery phase locked loop in the conventional sense. Receiver 116 takes transmitted data and forwards it to sample latches 118. The digital data and edge detector 122 and the selector 119 select the optimal sample from the available samples to send to the deserializing shift register 150. The sample is then transfered to 8/10 bit data register 152. The counter 154 provides overall clocking of fractional rate logic within the design. In other words, it divides the half rate clock coming out of the PLL 110, and produces a quarter rate clock, as well as an eighth rate clock and a tenth rate clock FIG. 2 illustrates in greater detail a block diagram of the receiver architecture of the present invention. A phase locked loop (PLL) 210 receives a signal from a reference clock 208. The PLL includes and controls a voltage controlled three-stage ring oscillator (VCO) running at half the bit frequency. This PLL 210 is shared by four receivers, one 216 being shown. The six phases from the VCO are fed into a phase rotator 212 having 54 steps for a $2\pi$ interval. The 54 steps are generated with a finite impulse response (FIR) phase rotator having six phases with three inter-slice phase steps that are further divided by three.

The six outputs of the rotator 212 are buffered, and the edges are shaped to be able to sample a signal having twice the frequency. One of the phase outputs is used as local recovered clock 214. A clock buffer (not shown) makes sure that it is not loading the phase rotator too much. Timing analysis determines which phase is the optimum to use. The output section of the phase rotator suppresses common mode signals and performs a limiting signal.

The output is then driven out (with the signals from the phase rotator) to the phase buffers and to a sample latch complex 218 which samples the incoming data. Six samples are taken over a two-bit interval. The sample latch complex is a CMOS, positive edge triggered latch. It takes differential data inputs and a single ended clock, and outputs a single ended, logic level signal. The complex consists of two circuits, the latch itself and a buffer that sharpens the output to the receive logic. The retiming latches 220 typically have a multiplexor (not shown) in front of them. This allows the latches to receive either sample latches 218 or input from the PRBS depending on whether data is being received from the receiver path or from the PRBS register 260. The pipeline stages from the PRBS register 260 reduce the probability of a metastable state to a value much lower than the targeted bit error rate. The retiming latches 220 also help to align the data to one single clock phase. In order to be able to process information from more than one bit interval for the recovery of one data bit, a memory stage 222 reuses four samples from the previous sampling period. A total of 10 samples is, therefore, fed into two half rate edge and two data detection correlation decoders 224, 226, 228, 230 that make use of a pattern recognition algorithm. Truth Table 3 represents the initial best guess for the data.

The outputs of the edge and data detector are the recovered two bits and the early and late signals going to the phase rotator control state machine 240. This involves the use of a bang-bang control circuit with adaptive step size. The state machine 240 can be viewed as a digital filter that evaluates the early and late signals and commands an adjustment of the sample point. The rotator counter 242 and temperature code generator 234 generate the 54 control signals for the phase rotator, and this closes the CDR loop.

The data path includes shift register 250 which loads two bits from the data correlation blocks during each half-rate cycle. The shift register is loaded to a word data register 252 (8 or 10 bits) using a word clock derived from the PLL clock. A rate counter
254 controls the shift register 250 and the 8/10 bit register 252.

The receiver also contains a pseudo-random bit stream (PRBS) generator and checker (shown within dotted lines 270 and 280) which allows for self-testing in a wrap mode as well as link testing with a corresponding transmitter. A built in self test is designed for use in receive loop-back mode. This involves a linear feedback shift register (LFSR) 272a which generates a random pattern code sequence. In this mode, the logic within the receiver core injects the generated code sequence into the first stage of the receive logic, monitors the deserialized receive data, synchronizes the receive data to the code sequence and verifies that a matching code sequence generated by a second LFSR 272b has arrived at the receiver output. The patterns are compared using an XOR 274.

This serves to monitor and control the performance of the phase rotator 212. Both of the LFSRs 272a, 272b are part of the PRBS function.

The receiver circuit is of a differential type containing fixed input bias (for power savings) which translates the input signal to that compatible with a high speed differential latch. The output circuits are powered-up to support the necessary loading from the latches and wiring. The receiver phase locked loop (PLL) is the clock source for oversampling the receive data and runs at half the data rate. It typically has a given operating range from e.g. 1.0625 Gbps to 1.5625 Gbps. A frequency reference is required which is one-half the target data rate. For example, 625 Mhz is required for an operational data rate of 1.25 Gbps. Six clock phases are buffered and brought out of the PLL and are intended to drive into a phase rotator circuit.

The PLL contains a three-stage voltage controlled ring oscillator, a 2× frequency divider, phase-frequency detector, charge pump and loop filter. These elements form the "fine" control loop. The VCO has both a "fine" and "coarse" control voltage in order to minimize the required gain of the fine loop. In addition to the fine control loop elements, the PLL contains a reference generator, a voltage comparator, PLL control logic, a digital to analog converter (DAC) and a low-pass filter. These elements form the "coarse" control loop.

The fine control loop is a conventional analog loop and is intended to provide a stable low-noise low-jitter clock source for the receiver. The range, gain and bandwidth of the loop are designed to compensate for relatively high frequency but small purtubations due to power supply changes and the coarse loop.

The coarse control loop is a digital representation of a conventional analog control loop based on a 'leaky' loop filter capacitor. That type of loop relies on leakage from the loop filter cap to drive the control voltage in a particular direction regardless of the frequency of the VCO. This leakage is compensated by a phase detector and charge pump that only increase the charge on the cap. The loop is stable when the charge being added to the cap balances the charge that is leaking. The PLL control logic in the coarse control loop has an up/down counter whose value represents the charge on a loop filter cap. This counter is slowly decremented to represent leakage. The voltage comparator is high or low depending on whether the fine control voltage is operating in the upper or lower half of its range. To balance the leakage, the control logic samples the comparator output. After multiple samples showing upper range operation, the up/down counter is incremented to represent adding charge to the loop filter cap. The up/down counter output is converted to a control voltage by the DAC and low-pass filter. The coarse control loop is intended to compensate for manufacturing process and relatively low frequency but large changes due to power supply and temperature drift.

The phase rotator is an analog circuit and, as such, is a device allowing a step by step, glitch-free modulo shift of all n phases of the ring oscillator at the input to any phase angle at the output. The modulo option is guaranteeing phase and frequency compensation capability, the glitch-free performance assures that no bits are lost during rotation, and 'step by step' means that the amount of phase change is limited to one phase slice for each clock cycle.

The concept of the phase rotator is based on finite impulse response (FIR) filter principles. A ring oscillator may be seen as a circular array of delay elements. By multiplying the outputs $t_n$ of the array with weighting factors $m_n$ and summing the values, an FIR filter is built. The number of taps determine the amount of oversampling and, therefore, the order of an analog filter required for alias filtering. If the weighting factors may be changed dynamically, the FIR filter response may be changed 'on the fly'. This allows the dynamic adjustment of the output phase of such a filter.

The following illustration shows the phase rotator principle looking at one of its outputs when using a ring oscillator with six phases as a driving device. In this illustration, there are nine different weighting factors m0 to m8 available. Each of these numbers is built by summing some of the sub-factors w1 to w8. Table 1 shows the composition of m0 to m8 from the sub-factors w1 to w8. The sub-factors may be implemented in a very simple way using parallel connected transistors with width ratios w1 to w8. The summed output current of these transistors corresponds to a weighting factor $m_n$. Only one sub-factor is added or subtracted at a time. An analog implementation of a summation (current summing) is not subject to any glitch. This would not be the case for an analog multiplication.

TABLE 1

| Weighting factor . . . | . . . built from . . . |
| --- | --- |
| m0 | = 0 (not used in initial configuration) |
| m1 | = w1 |
| m2 | = w1 + w2 |
| m3 | = w1 + w2 + w3 |
| m4 | = w1 + w2 + w3 + w4 |
| m5 | = w1 + w2 + w3 + w4 + w5 |
| m6 | = w1 + w2 + w3 + w4 +w5 + w6 |
| m7 | = w1 + w2 + w3 + w4 + w5 + w6 + w7 |
| m8 | = w1 + w2 + w3 + w4 + w5 + w6 + w7 + w8 |

The stepwise change of the output phase occurs by sequentially changing the weighting factors that determine the contribution from each phase tap to the actual output. For a 'clever' setting of the weight values w1 to w8, this will shift the output phase by exactly one-ninth of a phase slice. After the last rotating step, all weights have been shifted by one tap position. This corresponds to a shift of one phase slice at the output of the FIR.

By repetition of the above sequence, any phase setting may be tuned in. Because this is a circular operation, the range of the output phase is not limited to the 0 to 360 degree interval. This allows a continuous variation of the phase and thereby a frequency adjustment. Due to the fact that the weighting factors are only changed by adding or subtracting one sub-factor element at a time, no glitches can occur.

Each FIR coefficient c1 to c6 is controlled by a temperature code that determines whether a sub-factor is 'on' or 'off'. The temperature codes controlling the sub-factors for one phase step of a six-phase oscillator are given in Table 2. It may be seen that after nine steps, the codes are modulo shifted to the right by one coefficient position and, therefore, by one oscillator phase. The basic phase granularity of the oscillator (360 degrees divided by the number of oscillator phases) is divided by a factor of nine in this case. This is a big advantage because it will result in a lower static phase error.

TABLE 2

Temperature codes controlling which sub-factors are summed to form the actual coefficients c0 to c5 (two phase shifts)

| Step | c0 | c1 | c2 | c3 | c4 | c5 |
| --- | --- | --- | --- | --- | --- | --- |
| 0 | 000 000 111 | 000 111 111 | 111 111 111 | 111 111 111 | 000 111 111 | 000 000 111 |
| 1 | 000 000 011 | 000 111 111 | 111 111 111 | 111 111 111 | 000 111 111 | 000 001 111 |

TABLE 2-continued

Temperature codes controlling which sub-factors are summed to form the actual coefficients c0 to c5 (two phase shifts)

| Step | c0 | c1 | c2 | c3 | c4 | c5 |
|---|---|---|---|---|---|---|
| 2 | 000 000 001 | 000 111 111 | 111 111 111 | 111 111 111 | 000 111 111 | 000 011 111 |
| 3 | 000 000 000 | 000 111 111 | 111 111 111 | 111 111 111 | 000 111 111 | 000 111 111 |
| 4 | 000 000 000 | 000 111 111 | 011 111 111 | 111 111 111 | 001 111 111 | 000 111 111 |
| 5 | 000 000 000 | 000 111 111 | 001 111 111 | 111 111 111 | 011 111 111 | 000 111 111 |
| 6 | 000 000 000 | 000 111 111 | 000 111 111 | 111 111 111 | 111 111 111 | 000 111 111 |
| 7 | 000 000 001 | 000 011 111 | 000 111 111 | 111 111 111 | 111 111 111 | 000 111 111 |
| 8 | 000 000 011 | 000 001 111 | 000 111 111 | 111 111 111 | 111 111 111 | 000 111 111 |
| 9 | 000 000 111 | 000 000 111 | 000 111 111 | 111 111 111 | 111 111 111 | 000 111 111 |
| 10 | 000 001 111 | 000 000 011 | 000 111 111 | 111 111 111 | 111 111 111 | 000 111 111 |
| 11 | 000 011 111 | 000 000 001 | 000 111 111 | 111 111 111 | 111 111 111 | 000 111 111 |
| 12 | 000 111 111 | 000 000 000 | 000 111 111 | 111 111 111 | 111 111 111 | 000 111 111 |
| 13 | 000 111 111 | 000 000 000 | 000 111 111 | 011 111 111 | 111 111 111 | 001 111 111 |
| 14 | 000 111 111 | 000 000 000 | 000 111 111 | 001 111 111 | 111 111 111 | 011 111 111 |
| 15 | 000 111 111 | 000 000 000 | 000 111 111 | 000 111 111 | 111 111 111 | 111 111 111 |
| 16 | 000 111 111 | 000 000 001 | 000 011 111 | 000 111 111 | 111 111 111 | 111 111 111 |
| 17 | 000 111 111 | 000 000 011 | 000 001 111 | 000 111 111 | 111 111 111 | 111 111 111 |
| 18 | 000 111 111 | 000 000 111 | 000 000 111 | 000 111 111 | 111 111 111 | 111 111 111 |

It is understood that this table shows 18 steps for two phases of the oscillator 10 whereas a total of 54 steps is required for all six phases. The code for the remaining 36 steps can readily be determined from the pattern of the 18 steps shown on the table.

The receive phase buffers consist of circuits which are designed to interface to the output drive sections (all phases) of the phase rotator circuit, while subjecting the phase rotator to only light loading. The phase buffers then drive from the phase rotator to a set of latches while providing the required input drive necessary for the phase rotator circuit. The receive phase buffers operate at a rate necessary for a half rate design. The phase buffers also provide adequate rise and fall times taking into account the estimated net loadings.

The sample latches are fed data by the input receiver circuit, and obtain clocks from the combination of the PLL, phase rotator circuit, phase buffer complex. The data input to the sample latches is differential in nature and, as such, the sample latches are pseudo analog circuits. The design of the input receiver and the sample latches are very closely coordinated to minimize the effects of noise on the jitter associated with these two circuits. Typically, the sample latch is a CMOS positive edge triggered latch.

Figure 3:
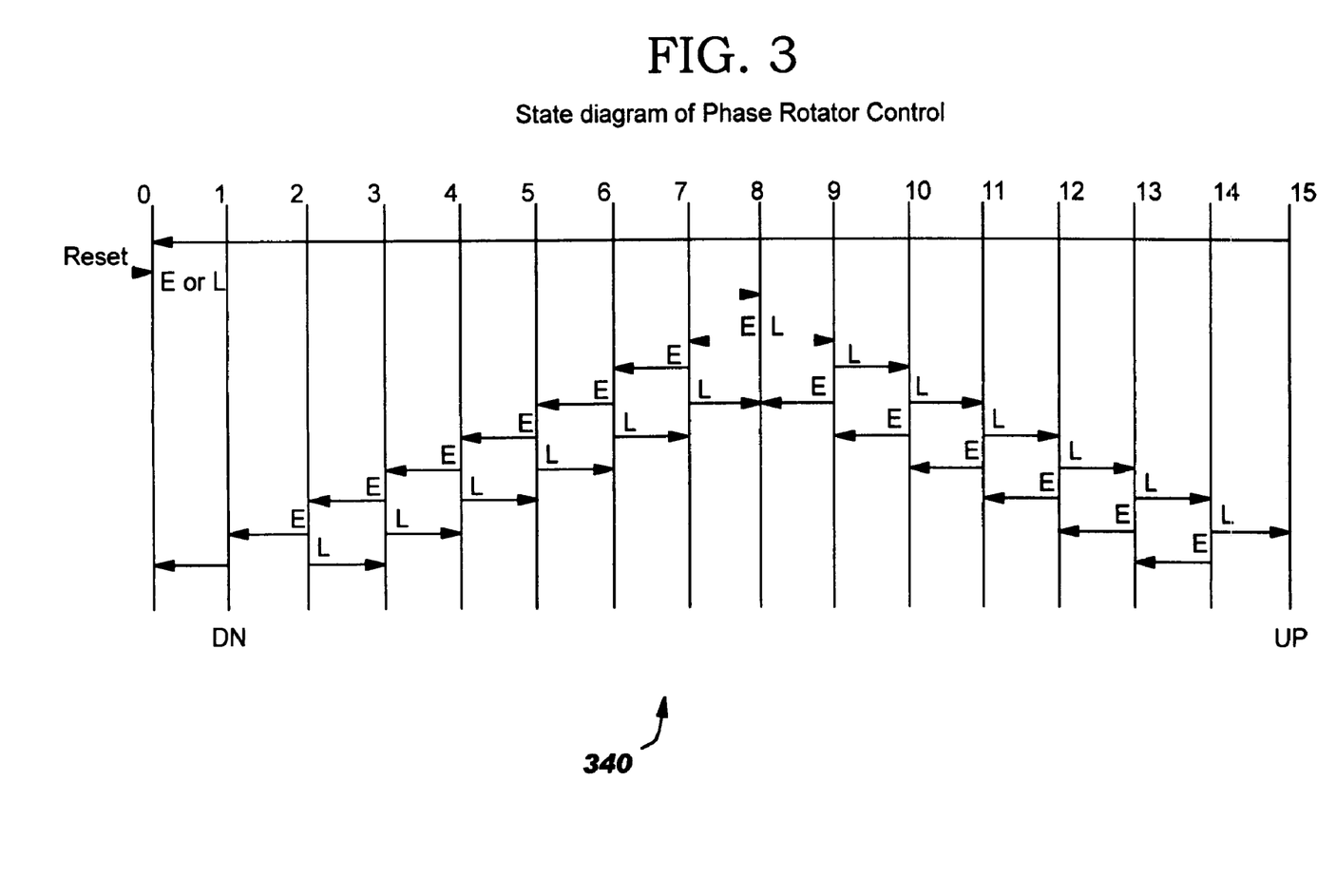
FIG. 3 shows an averaging pattern for a phase rotator control.

The method for the phase rotator control is an advanced bang-bang state machine with eight-fold initial early/late averaging, such as that shown in FIG. 3. It has 16 states and may be implemented using four latches. The state machine 340 has two inputs, one for early and one for late. The early and late signals are a function of the input sample pattern. They are generated by use of an edge and data correlation table of the type shown in Table 3.

TABLE 3

Full Rate Patterns for Early and Late Signals

| pattern | EL | pattern | EL | pattern | EL | pattern | EL |
|---|---|---|---|---|---|---|---|
| 0000000 | 00 G | 1111111 | 00 G | 0100101 | 00– | 1011010 | 00– |
| 0000001 | 01* | 1111110 | 01* | 1010010 | 00– | 0101101 | 00– |
| 1000000 | 10* | 0111111 | 10* | 0110010 | 00– | 1001101 | 00– |
| 0000010 | 00– | 1111101 | 00– | 0100110 | 00– | 1011001 | 00– |
| 0100000 | 00– | 1011111 | 00– | 0100111 | 00– | 1011000 | 00– |
| 0000011 | 00 G | 1111100 | 00 G | 1110010 | 00– | 0001101 | 00– |
| 1100000 | 00 G | 0011111 | 00 G | 0101001 | 00– | 1010110 | 00– |
| 0001000 | 00– | 1111011 | 00– | 1001010 | 00– | 0110101 | 00– |
| 0100000 | 00– | 1101111 | 00– | 0101010 | 00– | 1010101 | 00– |

TABLE 3-continued

Full Rate Patterns for Early and Late Signals

| pattern | EL | pattern | EL | pattern | EL | pattern | EL |
|---|---|---|---|---|---|---|---|
| 0000101 | 00– | 1111010 | 00– | 0101011 | 00– | 1010100 | 00– |
| 1010000 | 00– | 0101111 | 00– | 1101010 | 00– | 0010101 | 00– |
| 0000110 | 10? | 1111001 | 10? | 0110001 | 01– | 1001110 | 01? |
| 0110000 | 01? | 1001111 | 01? | 1000110 | 10– | 0111001 | 10? |
| 0001111 | 10* | 1111000 | 10* | 0110011 | 00– | 1001100 | 00– |
| 1110000 | 01* | 0001111 | 01* | 1100110 | 00– | 0011001 | 00– |
| 0001001 | 00– | 1110110 | 00– | 1000001 | 00– | 0111110 | 00– |
| 1001000 | 00– | 0110111 | 00– | 1000011 | 00 G | 0111100 | 00 G |
| 0001010 | 00– | 1110101 | 00– | 1100001 | 00 G | 0011110 | 00 G |
| 0101000 | 00– | 1010111 | 00– | 1000101 | 00– | 0111010 | 00– |
| 0001011 | 00– | 1110100 | 00– | 1010001 | 00– | 0101110 | 00– |
| 1101000 | 00– | 0010111 | 00– | 1000111 | 10* | 0111000 | 10* |
| 0010001 | 00– | 1101110 | 00– | 1110001 | 01* | 0001110 | 01* |
| 1000100 | 00– | 0111011 | 00– | 1001001 | 00– | 0110110 | 00– |
| 0010010 | 00– | 1101101 | 00– | 1001011 | 00– | 0110100 | 00– |
| 0100100 | 00– | 1011011 | 00– | 1101001 | 00– | 0010110 | 00– |
| 0010011 | 00– | 1101100 | 00– | 1010011 | 00– | 0101100 | 00– |
| 1100100 | 00– | 0011011 | 00– | 1100101 | 00– | 0011010 | 00– |
| 0100001 | 00– | 1011110 | 00– | 1100011 | 00 G | 0011100 | 00 G |
| 1000010 | 00– | 0111101 | 00– | 1100111 | 10? | 0011000 | 10? |
| 0100010 | 00 G | 1011101 | 00 G | 1110011 | 01? | 0001100 | 01? |
| 0100011 | 00 G | 1011100 | 00 G | 1101011 | 00– | 0010100 | 00– |
| 1100010 | 00 G | 0011101 | 00 G | 1110111 | 00– | 0001000 | 00– |

G = Good No Change
* = Clear Need to Move
? = Probable Need to Move
– = Not Enough Information Referring again to FIG. 3, the averaging effect is achieved in the following manner. The state machine 340 is set to 8. If several early signals in a row, but not enough to drive the state to '1', are followed by several late signals, the state machine averages them out. However, when a preponderance of early or late signals takes the state machine to '1' or '14', the state machine determines that the sampling is occurring too early or too late and determines whether to change the sample point. The state machine produces a 'late' signal when it gets to a state '1', and an 'early' signal when it gets to a state '14'. This output signal from the state machine, if it is a 'late' signal, instructs the rotation counter to adjust the sampling to a later point. Conversely, an 'early' signal will instruct the counter to adjust the sampling to an earlier point.

Figure 4:
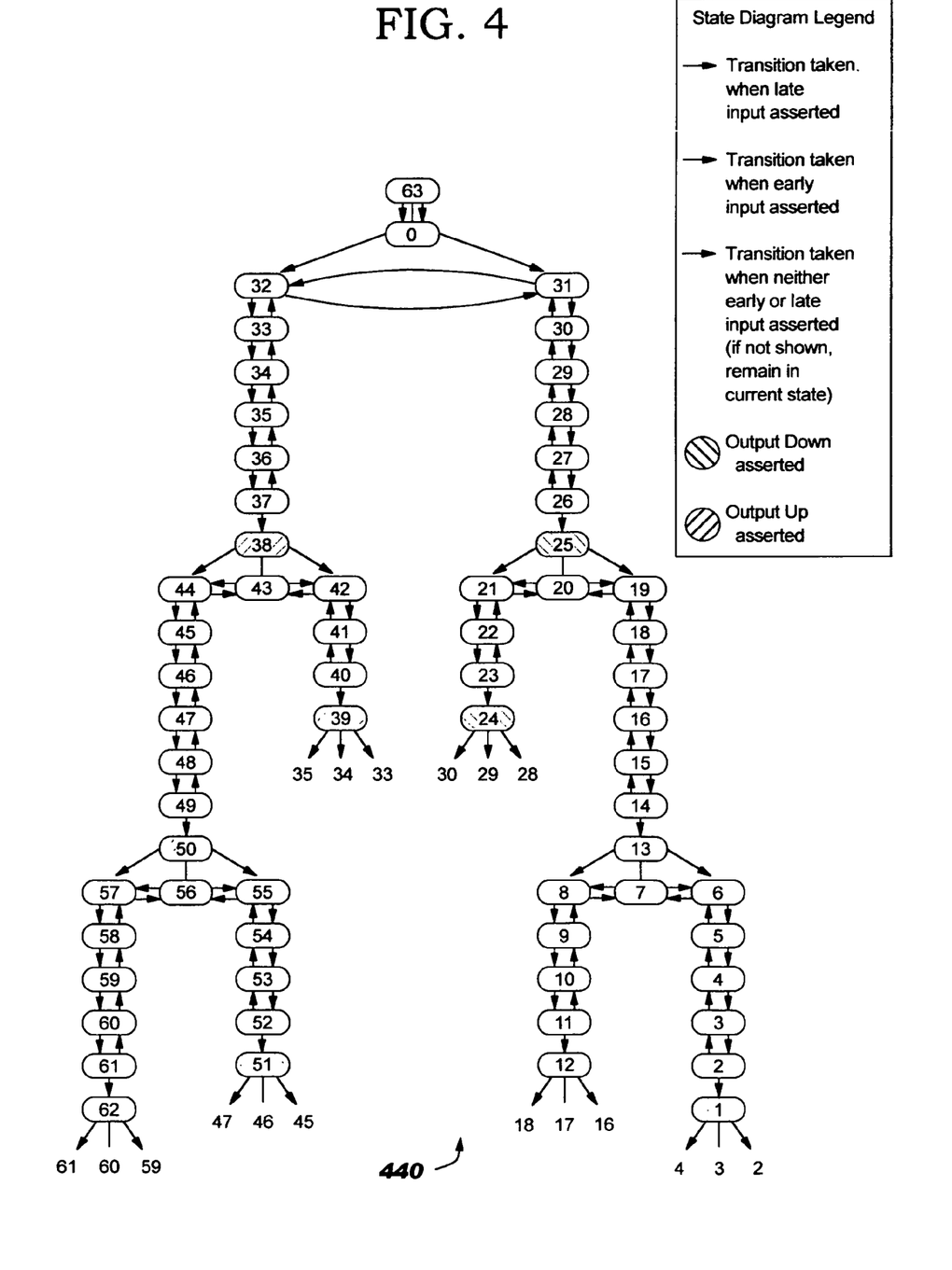
FIG. 4 shows another embodiment of an averaging pattern for a phase rotator control.

FIG. 4 shows the operation of a second embodiment of the state machine. This machine 440 combines early/late averaging with adaptive behavior that changes the amount of averaging based on the number of consecutive early or late inputs. When a sustained sequence of early or late inputs is received, this state machine reduces the amount of averaging in order to increase the stepping rate for the phase rotator. This state machine contains 64 states and requires six latches. As with the prior embodiment, the state machine is followed by an 'up and down' counter with 54 steps requiring six flip-flops. The counter has 54 steps, and controls where the sample point will be. The counter processes two bits at a time in parallel. Thus, there are 27 positions where the sample point can be set for each bit. That defines the limits of the resolution. As noted, the state machine determines whether to change the sample point and the counter determines where the new sample point will be.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A system for performing clock and data recovery on an incoming serial data stream comprising means for oversampling the incoming serial data stream including;
   a) an edge location detector for digitally locating the edge location of a bit in the incoming serial data stream;
   b) a digital circuit for creating an early or a late output signal if the detected edge is not in its expected location and for sending the signal to a phase rotator control state machine,
   c) the phase rotator control state machine serving to process the early or late outputs signal from the edge location detector, and
   d) a phase rotator having phase settings that are controlled by the phase rotator control state machine.

2. The system according to claim 1 wherein the edge location detector is provided with means for detecting at least three evenly spaced samples of each bit.

3. The system according to claim 2 further including a sample processing algorithm for centering the bit edge in the middle between two samples.

4. The system according to claim 3 wherein the sample processing algorithm comprises an adaptive behavior algorithm.

5. The system according to claim 1 wherein the phase rotator is a 54 step rotator comprising six phases with three inter-slice phase steps further divided by three.

6. The system according to claim 1 further including a phase locked loop comprising a digital coarse loop and an analog fine loop, wherein the digital coarse loop provides a PLL frequency control signal to the analog fine loop.

7. The system according to claim 6 wherein the phase locked loop controls a three-stage ring oscillator running at one-half bit frequency.

8. The system according to claim 1 wherein the phase rotator controls the phase output of a clock generator.

9. The method for improving the bit error rate performance during clock and data recovery on an incoming serial data stream comprising oversampling the incoming serial data stream including the steps of:
   a) digitally detecting the edge location of a bit in the incoming serial data stream;
   b) generating an early or a late signal if the detected edge is not in its expected location;
   c) sending the early or late signal to a phase rotation control state machine,
   d) processing the early or late outputs from the detected edge location using the phase rotation control state machine; and
   e) controlling the phase rotation using phase settings that are determined by the phase rotation control state machine.

10. The method according to claim 9 wherein at least three evenly spaced samples are obtained for each bit.

11. The method according to claim 10 wherein a sample processing algorithm centers the bit edge in the middle between two of the samples.

12. The method according to claim 11 wherein the sample processing algorithm is an adaptive behavior processing algorithm.

13. The method according to claim 9 wherein a feed back loop suppresses low frequency jitter and a feed forward loop suppresses high frequency jitter.

14. The method according to claim 9 wherein the phase rotation is used to control the phase output of a clock generator.

15. The method according to claim 9 wherein the samples are positioned so that none of the samples is on the bit edge, and the samples are placed on either side of the bit edge.

16. The method according to claim 9 wherein the phase locked loop is used to control a three-stage ring oscillator running at one-half bit frequency.

17. A receiver core for performing clock and data recovery on a wire transmitted incoming serial data stream, comprising:
   a) a phase locked loop running at one-half of the bit frequency;
   b) a ring oscillator controlled by a voltage signal and a current signal from the phase locked loop;
   c) a 54 step phase rotation device under the control of a phase rotator control state machine to control phase output of a clock generator;
   d) a detector for digitally detecting the edge position in the incoming serial data stream;
   e) means for digitally selecting the optimum data sample;
   f) a digital circuit for generating an early or a late signal if the detected edge is not in its expected position and for sending the signal to the phase rotation control state machine; and
   g) a phase rotator control state machine to process the early or late outputs from the edge correlation outputs to control the phase settings of the 54 step phase rotation device, wherein early and late signal generating circuitry controls the output phase position of the phase locked loop, said phase locked loop includes a feed back loop to suppress low frequency jitter and a feed forward loop to suppress high frequency jitter.

18. The receiver core according to claim 17 wherein the phase locked loop controls a three stage oscillator having both a fine control loop and a coarse control loop.

19. The receiver core according to claim 18 wherein the coarse control loop includes a reference generator, a voltage comparator, a PLL control logic, a digital to analog converter (DAC) and a low-pass filter.

* * * * *

UNITED STATES PATENT AND TRADEMARK OFFICE
CERTIFICATE OF CORRECTION

PATENT NO.    : 6,999,544 B2
DATED         : February 14, 2006
INVENTOR(S)   : Cranford, Jr. et al.

Page 1 of 1

It is certified that error appears in the above-identified patent and that said Letters Patent is hereby corrected as shown below:

Columns 9 and 10,
TABLE 3, should read as follows:
--                              TABLE 3                                              --.

Full Rate Patterns for Early and Late Signals

| pattern | EL | pattern | EL | pattern | EL | pattern | EL |
|---|---|---|---|---|---|---|---|
| 0000000 | 00 G | 1111111 | 00 G | 0100101 | 00 - | 1011010 | 00 - |
| 0000001 | 01 * | 1111110 | 01 * | 1010010 | 00 - | 0101101 | 00 - |
| 1000000 | 10 * | 0111111 | 10 * | 0110010 | 00 - | 1001101 | 00 - |
| 0000010 | 00 - | 1111101 | 00 - | 0100110 | 00 - | 1011001 | 00 - |
| 0100000 | 00 - | 1011111 | 00 - | 0100111 | 00 - | 1011000 | 00 - |
| 0000011 | 00 G | 1111100 | 00 G | 1110010 | 00 - | 0001101 | 00 - |
| 1100000 | 00 G | 0011111 | 00 G | 0101001 | 00 - | 1010110 | 00 - |
| 0000100 | 00 - | 1111011 | 00 - | 1001010 | 00 - | 0110101 | 00 - |
| 0010000 | 00 - | 1101111 | 00 - | 0101010 | 00 - | 1010101 | 00 - |
| 0000101 | 00 - | 1111010 | 00 - | 0101011 | 00 - | 1010100 | 00 - |
| 1010000 | 00 - | 0101111 | 00 - | 1101010 | 00 - | 0010101 | 00 - |
| 0000110 | 10 ? | 1111001 | 10 ? | 0110001 | 01 - | 1001110 | 01 ? |
| 0110000 | 01 ? | 1001111 | 01 ? | 1000110 | 10 - | 0111001 | 10 ? |
| 0000111 | 10 * | 1111000 | 10 * | 0110011 | 00 - | 1001100 | 00 - |
| 1110000 | 01 * | 0001111 | 01 * | 1100110 | 00 - | 0011001 | 00 - |
| 0001001 | 00 - | 1110110 | 00 - | 1000001 | 00 - | 0111110 | 00 - |
| 1001000 | 00 - | 0110111 | 00 - | 1000011 | 00 G | 0111100 | 00 G |
| 0001010 | 00 - | 1110101 | 00 - | 1100001 | 00 G | 0011110 | 00 G |
| 0101000 | 00 - | 1010111 | 00 - | 1000101 | 00 - | 0111010 | 00 - |
| 0001011 | 00 - | 1110100 | 00 - | 1010001 | 00 - | 0101110 | 00 - |
| 1101000 | 00 - | 0010111 | 00 - | 1000111 | 10 * | 0111000 | 10 * |
| 0010001 | 00 - | 1101110 | 00 - | 1110001 | 01 * | 0001110 | 01 * |
| 1000100 | 00 - | 0111011 | 00 - | 1001001 | 00 - | 0110110 | 00 - |
| 0010010 | 00 - | 1101101 | 00 - | 1001011 | 00 - | 0110100 | 00 - |
| 0100100 | 00 - | 1011011 | 00 - | 1101001 | 00 - | 0010110 | 00 - |
| 0010011 | 00 - | 1101100 | 00 - | 1010011 | 00 - | 0101100 | 00 - |
| 1100100 | 00 - | 0011011 | 00 - | 1100101 | 00 - | 0011010 | 00 - |
| 0100001 | 00 - | 1011110 | 00 - | 1100011 | 00 G | 0011100 | 00 G |
| 1000010 | 00 - | 0111101 | 00 - | 1100111 | 10 ? | 0011000 | 10 ? |
| 0100010 | 00 G | 1011101 | 00 G | 1110011 | 01 ? | 0001100 | 01 ? |
| 0100011 | 00 G | 1011100 | 00 G | 1101011 | 00 - | 0010100 | 00 - |
| 1100010 | 00 G | 0011101 | 00 G | 1110111 | 00 - | 0001000 | 00 - |

Signed and Sealed this

Thirteenth Day of June, 2006

JON W. DUDAS
*Director of the United States Patent and Trademark Office*